(12) United States Patent
Noda

(10) Patent No.: US 6,720,632 B2
(45) Date of Patent: Apr. 13, 2004

(54) SEMICONDUCTOR DEVICE HAVING DIFFUSION LAYER FORMED USING DOPANT OF LARGE MASS NUMBER

(75) Inventor: Taiji Noda, Yao (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/865,546

(22) Filed: May 29, 2001

(65) Prior Publication Data

US 2002/0001926 A1 Jan. 3, 2002

(30) Foreign Application Priority Data

Jun. 20, 2000 (JP) .......................... 2000-185025

(51) Int. Cl.[7] .......................... H01L 29/76; H01L 29/94; H01L 31/062
(52) U.S. Cl. ......................... 257/408; 438/973
(58) Field of Search ................ 257/344, 345, 257/346, 408, 412; 438/973

(56) References Cited

U.S. PATENT DOCUMENTS

| 4,476,622 A | * | 10/1984 | Cogan ..................... 438/187 |
| 4,969,031 A | * | 11/1990 | Kobayashi et al. ......... 257/64 |
| 5,177,569 A | * | 1/1993 | Koyama et al. ............ 257/412 |
| 5,869,359 A | * | 2/1999 | Prabhakar ................. 438/149 |
| 6,063,682 A | * | 5/2000 | Sultan et al. .............. 438/305 |
| 6,093,951 A | * | 7/2000 | Burr .......................... 257/408 |

FOREIGN PATENT DOCUMENTS

| JP | 8293509 | 11/1996 |
| JP | 8340002 | 12/1996 |

OTHER PUBLICATIONS

Noda et al., "Effects of End–of–Range Dislocation Loops on Transient Enhanced Diffusion of Indium Implanted in Silicon", pp. 4980–4984, Nov. 1, 2000, Journal of Applied Physics, vol. 88, No. 9.

* cited by examiner

Primary Examiner—Evan Pert
Assistant Examiner—Asok Kumar Sarkar
(74) Attorney, Agent, or Firm—Nixon Peabody LLP; Donald R. Studebaker

(57) ABSTRACT

Between a source/drain heavily-doped diffusion layer and a region below a side face of a gate electrode in an epitaxial semiconductor substrate, an extension heavily-doped diffusion layer where N-type As ions are diffused is formed to have shallower junction than the source/drain heavily-doped diffusion layer. A pocket heavily-doped diffusion layer where P-type indium ions, that is, heavy ions having a relatively large mass number, are diffused is formed under the extension heavily-doped diffusion layer.

25 Claims, 8 Drawing Sheets

SEMICONDUCTOR DEVICE HAVING DIFFUSION LAYER FORMED USING DOPANT OF LARGE MASS NUMBER

BACKGROUND OF THE INVENTION

The present invention relates to a MIS semiconductor device that has a fine structure for realizing high integration of a semiconductor integrated circuit and is capable of operating at high speed and low consumption power and a method for fabricating the same.

In accordance with increase in integration of semiconductor integrated circuits, there is a demand for refinement of MIS semiconductor devices, in particular, MIS transistors, and for this purpose, a MIS transistor with shallow junction is desired.

A method for fabricating a conventional MIS transistor will now be described with reference to FIGS. 8A through 8E.

First, as shown in FIG. 8A, indium (In) ions, that is, a P-type dopant, are implanted at acceleration energy of 200 keV and a dose of approximately $1 \times 10^{12}/cm^2$ into a semiconductor substrate 101 of P-type silicon having a principal plane with a <100>-oriented zone axis. After the implantation, annealing is carried out, so as to form a P-type channel diffusion layer 110a serving as a channel region in an upper portion of the semiconductor substrate 101. Subsequently, a gate insulating film 102 with a thickness of approximately 2.2 nm is formed on the semiconductor substrate 101 and a gate electrode 103 of polysilicon with a thickness of approximately 200 nm is formed thereon.

Next, as shown in FIG. 8B, with the gate electrode 103 used as a mask, In ions, that is, a P-type dopant, are implanted into the semiconductor substrate 101 at acceleration energy of 100 keV and a dose of approximately $1 \times 10^{14}/cm^2$. At this point, a current density for implanting the In ions is approximately 1000 $\mu A/cm^2$, and the ions are implanted at an angle of approximately 0 through 7 degrees against the normal line of the substrate. Subsequently, arsenic (As) ions, that is, an N-type dopant, are implanted into the semiconductor substrate 101 at acceleration energy of 10 keV and a dose of $5 \times 10^{14}/cm^2$. Thereafter, annealing is carried out at a high temperature for a short period of time, so as to form a P-type dopant diffusion layer 104A and an N-type heavily-doped diffusion layer 105A with shallow junction in a source/drain region of the semiconductor substrate 101.

Then, as shown in FIG. 8C, a silicon nitride film with a thickness of approximately 50 nm is deposited on the entire surface of the semiconductor substrate 101 at approximately 700° C., and the deposited silicon nitride film is subjected to anisotropic etching, thereby forming a sidewall 106 on the side face of the gate electrode 103. The sidewall 106 may be formed from a silicon oxide film instead of the silicon nitride film.

Next, as shown in FIG. 8D, with the gate electrode 103 and the sidewall 106 used as a mask, As ions, that is, an N-type dopant, are implanted into the semiconductor substrate 101 at acceleration energy of 30 keV and a dose of approximately $3 \times 10^{15}/cm^2$, and then annealing is carried out at a high temperature for a short period of time. Thus, an N-type source/drain heavily-doped diffusion layer 107 with deep junction is formed in the source/drain region of the semiconductor substrate 101, an N-type extension region heavily-doped diffusion layer 105B with shallower junction than the source/drain heavily-doped diffusion layer 107 is formed on the inside of the source/drain heavily-doped diffusion layer 107, and a P-type pocket region of heavily-doped diffusion layer 104B is formed under the extension region heavily-doped diffusion layer 105B.

Next, as shown in FIG. 8E, after a metal film of cobalt or titanium with a thickness of approximately 10 nm and a titanium nitride film with a thickness of approximately 20 nm are successively deposited on the semiconductor substrate 101 by sputtering, annealing is carried out at approximately 550° C. for 10 seconds. Thereafter, the titanium nitride film and an unreacted portion of the metal film are removed by selectively etching them with a mixture of sulfuric acid, hydrogen peroxide and water. Subsequently, annealing is carried out at approximately 800° C. for ten seconds, so as to form a cobalt silicide layer 108 with a thickness of approximately 30 nm in a self-alignment manner in upper portions of the gate electrode 103 and the source/drain heavily-doped diffusion layer 107.

In this manner, in the conventional method for fabricating a MIS transistor, In ions, that is, heavy ions, are used for the ion implantation for forming the pocket heavily-doped diffusion layer 104B, so as to realize abrupt dopant profile with shallow junction.

In the conventional method for fabricating a MIS transistor, however, since the heavy ions are used for forming the pocket heavily-doped diffusion layer 104B, an amorphous layer is formed in the semiconductor substrate 101 when the ions are implanted at a dose exceeding a predetermined dose because the implantation of the heavy ions largely damages the crystal of the semiconductor substrate 101. Furthermore, through the annealing carried out after the implantation, an EOR (end-of-range) dislocation loop defect layer is formed below the amorphous-crystal interface, and the heavy ions such as In ions are largely segregated in the EOR dislocation loop defect layer.

In particular, in the dopant implantation using heavy ions, the amorphous-crystal interface is formed in a position deeper than the concentration peek of the dopant, and hence, the junction plane obtained after diffusion of the extension heavily-doped diffusion layer 105B is formed in a position deeper than a designed depth. Furthermore, when the EOR dislocation loop defect layer is formed in the vicinity of the junction plane of the extension region of heavily-doped diffusion layer 105B, junction leakage is disadvantageously caused.

However, unless heavy ions with a relatively large mass number is used for forming a heavily-doped diffusion layers such as a pocket region and an extension region, it is very difficult to attain shallower junction with currently existing transient enhanced diffusion suppressed. For example, in a CMOS transistor with a design rule of 0.1 $\mu m$, junction depth of approximately 20 nm through 30 nm is required of the extension heavily-doped diffusion layer 105B. In this case, the As ions are probably moved by as large as approximately several tens nm owing to the transient enhanced diffusion caused by the annealing carried out at a low temperature for forming the sidewall 106. Accordingly, when a MIS transistor is further refined, even when the ion implantation is carried out at small acceleration energy, the junction depth of the extension heavily-doped diffusion layer 105B is unavoidably increased to exceed a target value through the subsequent annealing.

The transient enhanced diffusion is a phenomenon that excess point defects and an implanted dopant are diffused through the interaction, resulting in diffusing the dopant more largely than the diffusion coefficient in the thermal equilibrium state.

SUMMARY OF THE INVENTION

The present invention was devised for overcoming the aforementioned conventional problems, and an object is suppressing occurrence of dislocation loop defects derived from heavy ions while using the heavy ions indispensable for attaining shallow junction in forming heavily-doped diffusion layers serving as an extension region and a pocket region.

In order to achieve the object, in a MIS semiconductor device and a fabrication method for the same according to the invention, a semiconductor substrate capable of suppressing the formation of a defect layer is used, or heavy ions are implanted so as to reduce implantation damage caused during the implantation and so as to minimally form a defect layer in a semiconductor substrate itself.

Specifically, the first semiconductor device of this invention comprises a heavily-doped diffusion layer formed, by using a dopant ion having a relatively large mass number, in an epitaxial region of silicon included in at least an upper portion of an epitaxial semiconductor substrate.

In general, a semiconductor obtained by the epitaxial growth is superior in the crystal quality to a semiconductor obtained by the general rotational pulling (CZ) method. Accordingly, since the semiconductor device of this invention includes the heavily-doped diffusion layer formed by implantation and diffusion of the dopant heavy ions in the epitaxial region, EOR dislocation loop defects are less caused than in a general semiconductor substrate. As a result, the heavy ions are minimally segregated in a region below an amorphous-crystal interface, and hence, the semiconductor device can be refined with a leakage current derived from the segregation suppressed.

In the first semiconductor device, the epitaxial region preferably has a <110>-oriented zone axis.

In the first semiconductor device, the heavily-doped diffusion layer is preferably formed by using, as the dopant ion, an indium ion at a dose of $5 \times 10^{13}/\mathrm{cm}^{-2}$ or more. Since the heavily-doped diffusion layer can be thus changed into an amorphous layer, channeling of another dopant ion subsequently implanted can be suppressed, resulting in definitely forming the heavily-doped diffusion layer so as to have shallow junction.

In the first semiconductor device, the heavily-doped diffusion layer preferably corresponds to a pocket region of heavily-doped diffusion layer of a MIS semiconductor device, and the MIS semiconductor device preferably includes a gate electrode formed above the epitaxial region with a gate insulating film sandwiched therebetween; a source/drain heavily-doped diffusion layer of a first conductivity type formed in a source/drain region of the epitaxial region at a distance from a region below a side face of the gate electrode; an extension region heavily-doped diffusion layer of the first conductivity type formed in the epitaxial region between the source/drain heavily-doped diffusion layer and the region below the side face of the gate electrode and having shallower junction than the source/drain heavily-doped diffusion layer; and the pocket region of heavily-doped diffusion layer of a second conductivity type formed in the epitaxial region under the extension heavily-doped diffusion layer. In this manner, the pocket region of heavily-doped diffusion layer is formed from the heavily-doped diffusion layer of this invention, and hence, the extension region heavily-doped diffusion layer and the pocket region of heavily-doped diffusion layer formed between the source/drain heavily-doped diffusion layers can attain shallow junction.

In this case, the extension region heavily-doped diffusion layer is preferably formed by using an antimony ion as a dopant. In this manner, since an antimony ion is an N-type heavy ion, the junction depth of the extension region heavily-doped diffusion layer can also definitely attain shallow junction.

The second semiconductor device of this invention comprises a heavily-doped diffusion layer formed, by using a dopant ion having a relatively large mass number, in a semiconductor substrate having a <110>-oriented zone axis.

Since the second semiconductor device uses the semiconductor substrate having the <110>-oriented zone axis, the implanted heavy ion is channeled and hence less collides with a silicon atom, resulting in reducing implantation damage of the semiconductor substrate. As a result, formation of interstitial silicon is suppressed and EOR dislocation loop defects are less caused, so that the heavy ions can be minimally segregated in the region below the original amorphous-crystal interface.

In the second semiconductor device, the heavily-doped diffusion layer is preferably formed by using, as the dopant ion, an indium ion at a dose of $5 \times 10^{13}/\mathrm{cm}^{-2}$ or more.

In the second semiconductor device, the heavily-doped diffusion layer preferably corresponds to a pocket heavily-doped diffusion layer of a MIS semiconductor device, and the MIS semiconductor device preferably includes a gate electrode formed above the semiconductor substrate with a gate insulating film sandwiched therebetween; a source/drain heavily-doped diffusion layer of a first conductivity type formed in a source/drain region of the semiconductor substrate at a distance from a region below a side face of the gate electrode; an extension region heavily-doped diffusion layer of the first conductivity type formed in the semiconductor substrate between the source/drain heavily-doped diffusion layer and the region below the side face of the gate electrode and having shallower junction than the source/drain heavily-doped diffusion layer; and the pocket region of heavily-doped diffusion layer of a second conductivity type formed in the semiconductor substrate under the extension heavily-doped diffusion layer.

In this case, the extension region heavily-doped diffusion layer is preferably formed by using an antimony ion as a dopant.

The first method for fabricating a semiconductor device of this invention comprises a step of forming a heavily-doped diffusion layer by implanting a dopant ion having a relatively large mass number into an epitaxial region of silicon included in at least an upper portion of an epitaxial semiconductor substrate.

Since a pocket region of heavily-doped diffusion layer is formed by implantation and diffusion of the dopant heavy ion in the epitaxial region of silicon in the first method for fabricating a semiconductor device, the heavy ion is minimally segregated in the region below the original amorphous-crystal interface. Accordingly, the semiconductor device can be refined with a leakage current derived from the segregation suppressed.

In the first method for fabricating a semiconductor device, the epitaxial region preferably has a <110>-oriented zone axis.

In the first method for fabricating a semiconductor device, the heavily-doped diffusion layer is preferably formed by using, as the dopant ion, an indium ion at a dose of $5 \times 10^{3}/\mathrm{cm}^{2}$ or more. Since the first dopant layer can be thus changed into an amorphous layer, the channeling of the second dopant subsequently implanted can be suppressed.

Accordingly, the extension region heavily-doped diffusion layer and the pocket region of heavily-doped diffusion layer can definitely attain shallow junction, resulting in realizing a semiconductor device with high driving power.

In the first method for fabricating a semiconductor device, the heavily-doped diffusion layer preferably corresponds to a pocket region of heavily-doped diffusion layer of a MIS semiconductor device, and the method for fabricating the MIS semiconductor device preferably includes the steps of forming a gate electrode above the epitaxial region with a gate insulating film sandwiched therebetween; forming a first dopant layer to be used as the pocket region of heavily-doped diffusion layer by implanting a first dopant of a first conductivity type corresponding to the dopant ion into the epitaxial region with the gate electrode used as a mask; forming a second dopant layer to be used as an extension region heavily-doped diffusion layer by implanting a second dopant of a second conductivity type into the epitaxial region to have shallower junction than the first dopant layer with the gate electrode used as a mask; and forming a sidewall on a side face of the gate electrode, and forming a third dopant layer to be used as a source/drain heavily-doped diffusion layer by implanting a third dopant of the second conductivity type into the epitaxial region to have deeper junction than the second dopant layer with the gate electrode and the sidewall used as a mask. In this manner, the extension region heavily-doped diffusion layer formed between the source/drain heavily-doped diffusion layers and the pocket region of heavily-doped diffusion layer formed under the extension region heavily-doped diffusion layer can attain shallow junction.

In this case, the first method for fabricating a semiconductor device preferably further comprises a step of forming a fourth dopant layer to be used as a channel diffusion layer by implanting a fourth dopant of the first conductivity type into the epitaxial region before forming the gate electrode. In this manner, when an In ion, that is, a heavy ion, is used as a dopant for the channel diffusion layer, a dopant concentration distribution in which the concentration of the In ions is low in the vicinity of the surface of the epitaxial region and is abrupt in a position slightly deeper than the vicinity of the surface can be attained. Accordingly, the semiconductor device can be refined without degrading the driving power of the transistor.

In this case, the second dopant is preferably an antimony ion.

The second method for fabricating a semiconductor device of this invention comprises a step of forming a heavily-doped diffusion layer by implanting a dopant ion having a relatively large mass number into a semiconductor substrate under conditions for suppressing dislocation loop defects caused in the semiconductor substrate.

In the second method for fabricating a semiconductor device, the occurrence of dislocation loop defects can be suppressed in the semiconductor substrate during the implantation of the dopant ion for forming the heavily-doped diffusion layer. Therefore, the heavy ion is minimally segregated in the region below the amorphous-crystal interface, and hence, a leakage current derived from the segregation can be suppressed.

In the second method for fabricating a semiconductor device, the heavily-doped diffusion layer is preferably formed by using, as the dopant ion, an indium ion at a dose of $5 \times 10^{13}/cm^{-2}$ or more.

In the second method for fabricating a semiconductor device, the dopant ion is preferably implanted at a current density of approximately 100 $\mu A/cm^2$ or less.

In the second method for fabricating a semiconductor device, the dopant ion is preferably implanted at an angle of approximately 30 degrees or more against a vertical direction to a substrate surface of the semiconductor substrate.

In the second method for fabricating a semiconductor device, the heavily-doped diffusion layer preferably corresponds to a pocket heavily-doped diffusion layer of a MIS semiconductor device, and the method for fabricating the MIS semiconductor device preferably includes the steps of forming a gate electrode above the semiconductor substrate with a gate insulating film sandwiched therebetween; forming a first dopant layer to be used as the pocket region of heavily-doped diffusion layer by implanting a first dopant of a first conductivity type corresponding to the dopant ion into the semiconductor substrate with the gate electrode used as a mask; forming a second dopant layer to be used as an extension region heavily-doped diffusion layer by implanting a second dopant of a second conductivity type into the semiconductor substrate to have shallower junction than the first dopant layer with the gate electrode used as a mask; and forming a sidewall on a side face of the gate electrode, and forming a third dopant layer to be used as a source/drain heavily-doped diffusion layer by implanting a third dopant of the second conductivity type into the semiconductor substrate to have deeper junction than the In this case, the second method for fabricating a semiconductor device preferably further comprises a step of forming a fourth dopant layer to be used as a channel diffusion layer by implanting a fourth dopant of the first conductivity type into the semiconductor substrate before forming the gate electrode.

In this case, the second dopant is preferably an antimony ion.

The third method for fabricating a semiconductor device of this invention comprises a step of forming a heavily-doped diffusion layer by implanting a dopant ion having a relatively large mass number into a semiconductor substrate having a <110>-oriented zone axis.

In the third method for fabricating a semiconductor device, in implanting the dopant ion into the semiconductor substrate for forming the heavily-doped diffusion layer, the heavy ion is channeled in the semiconductor substrate having the <110>-oriented zone axis. Therefore, the implantation damage of the semiconductor substrate is reduced and the formation of interstitial silicon is suppressed, and hence, EOR dislocation loop defects are less caused, resulting in suppressing a leakage current derived from the segregation. Also, even when the heavy ion is channeled, the implantation range is less largely increased owing to the mass effect of the heavy ion than that of a light ion, and hence, shallow junction can be realized.

In the third method for fabricating a semiconductor device, the heavily-doped diffusion layer preferably corresponds to a pocket region of heavily-doped diffusion layer of a MIS semiconductor device, and the method for fabricating the MIS semiconductor device preferably includes the steps of forming a gate electrode above the semiconductor substrate with a gate insulating film sandwiched therebetween; forming a first dopant layer to be used as the pocket region of heavily-doped diffusion layer by implanting a first dopant of a first conductivity type corresponding to the dopant ion into the semiconductor substrate with the gate electrode used as a mask; forming a second dopant layer to be used as an extension region heavily-doped diffusion layer by implanting a second dopant of a second conductivity type into the semiconductor substrate to have shallower junction than the first dopant layer with the gate electrode used as a mask; and forming a sidewall on a side face of the gate electrode, and forming a third dopant layer to be used as a source/drain heavily-doped diffusion layer by implanting a third dopant of the second conductivity type into the semiconductor substrate to have deeper junction than the second dopant layer with the gate electrode and the sidewall used as a mask.

The third method for fabricating a semiconductor device preferably further comprises a step of forming a fourth dopant layer to be used as a channel diffusion layer by implanting a fourth dopant of the first conductivity type into the semiconductor substrate before forming the gate electrode.

In the third method for fabricating a semiconductor device, the second dopant is preferably an antimony ion.

DETAILED DESCRIPTION OF THE INVENTION

Embodiment 1

Embodiment 1 of the invention will now be described with reference to the accompanying drawings.

Figure 1A:
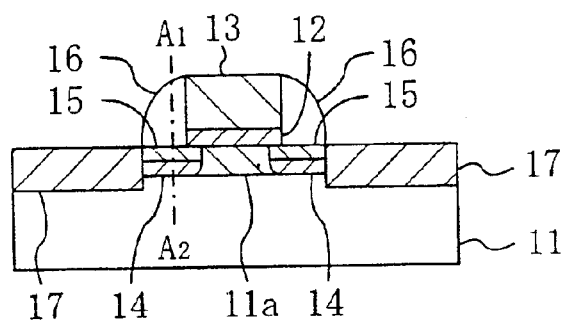
FIG. 1A is a cross-sectional view of a MIS transistor according to Embodiment 1 of the invention and FIG. 1B is a graph for showing a dopant concentration in a depth direction from a substrate surface along line $A_1$-$A_2$ of FIG. 1A.
Figure 1B:
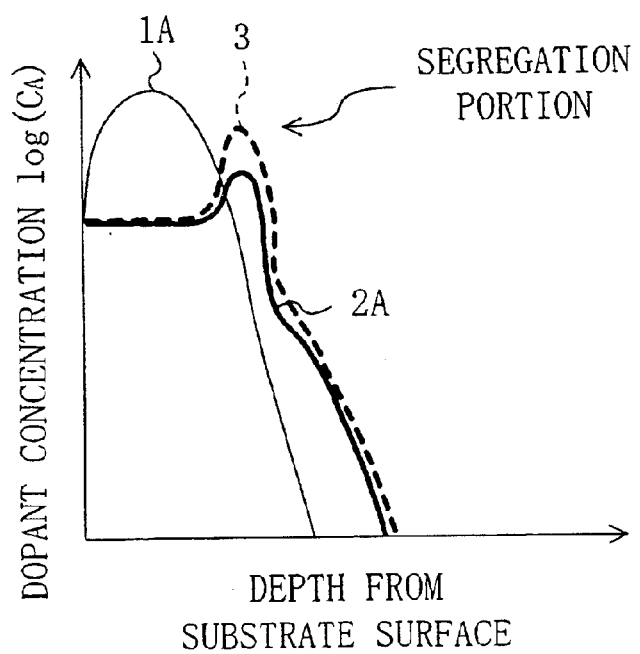

FIG. 1A is a cross-sectional view of a MIS transistor according to Embodiment 1 of the invention, and FIG. 1B is a graph for showing a dopant concentration in a depth direction from the substrate surface along line $A_1$-$A_2$ of FIG. 1A.

As shown in FIG. 1A, a gate insulating film 12 is formed on an epitaxial semiconductor substrate 11 formed through epitaxial growth of, for example, P-type silicon, and a gate electrode 13 of polysilicon is formed on the gate insulating film 12.

In an upper portion of the epitaxial semiconductor substrate 11, source/drain heavily-doped diffusion, layers 17 where N-type arsenic (As) ions are diffused are formed in source/drain regions positioned on both sides of a sidewall 16 of the gate electrode 13 at a distance from a region below each side face of the gate electrode 13. An extension heavily-doped diffusion layer 15 where N-type As ions are diffused so as to have shallower junction than the source/drain heavily-doped diffusion layer 17 is formed between the source/drain heavily-doped diffusion layer 17 and the region below the side face of the gate electrode 13. A pocket region of heavily-doped diffusion layer 14 where P-type indium (In) ions, that is, heavy ions with a relatively large mass number, are diffused is formed under the extension region heavily-doped diffusion layer 15. Also, a channel diffusion layer 11a where P-type In ions are diffused is formed in a region under the gate electrode 13 in the epitaxial semiconductor substrate 11 sandwiched between the extension region heavily-doped diffusion layers 15 and between the pocket region of heavily-doped diffusion layers 14.

In this manner, the MIS transistor of this embodiment is characterized by including the pocket region of heavily-doped diffusion layer 14 formed by diffusing the In ions, that is, the heavy ions, in the epitaxial semiconductor substrate 11.

In FIG. 1B, a curve 1A indicates an As ion concentration in the extension region heavily-doped diffusion layer 15, and a curve 2A indicates an In ion concentration in the pocket region of heavily-doped diffusion layer 14. A broken curve 3 indicates, as a comparison, an In ion concentration in a pocket region of heavily-doped diffusion layer formed by using a silicon wafer prepared by a general rotational pulling (CZ) method as the semiconductor substrate.

In the semiconductor fabrication process, a heavy ion having a relatively large mass number, such as an In ion, exhibits abrupt implantation profile as compared with an ion having a relatively small mass number such as a boron (B) ion. In addition, as shown in FIG. 1B, the heavy ions are less diffused in a tale portion with a low concentration in the dopant profile, namely, in a deep region, owing to segregation in a defect layer or surface diffusion. Therefore, an abrupt profile can be realized in not only the curve 1A of the dopant concentration in the extension region heavily-doped diffusion layer 15 but also the curve 2A of the dopant concentration in the pocket region of heavily-doped diffusion layer 14. As a result, even in a MIS transistor with a small gate length, shallow junction can be obtained, so as to realize high driving power. Furthermore, since the extension region heavily-doped diffusion layer 15 and the pocket region of heavily-doped diffusion layer 14 can attain shallow junction, the short channel effect can be suppressed, and hence, a fine transistor can be designed.

Also, as understood from FIG. 13, since the epitaxial semiconductor substrate 11 is used as the semiconductor substrate in this embodiment, occurrence of EOR dislocation loop defects is reduced in the dopant curve 2A of the pocket region of heavily-doped diffusion layer 14 of this embodiment as compared with that in the dopant curve 3 of the pocket region of heavily-doped diffusion layer formed in the semiconductor substrate prepared by the conventional CZ method. As a result, the peak of the segregation of the In ions in the EOR dislocation loop defect layer can be lowered. Accordingly, a leakage current derived from the heavy ions segregated in the EOR dislocation loop defect layer can be suppressed.

Now, a method for fabricating the MIS transistor having the aforementioned structure will be described with reference to the accompanying drawings.

FIGS. 2A through 2D are cross-sectional views for showing procedures in the method for fabricating the MIS transistor of Embodiment 1.

Figure 2A:
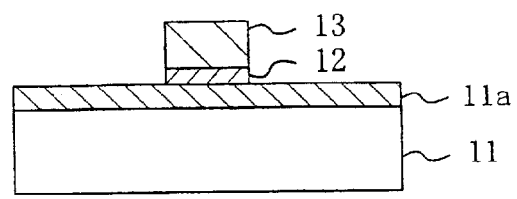
FIGS. 2A, 2B, 2C and 2D are cross-sectional views for showing procedures in a method for fabricating the MIS transistor of Embodiment 1.

First, as shown in FIG. 2A, P-type dopant ions having a relatively large mass number, such as indium (In) ions, are implanted at acceleration energy of approximately 200 keV and a dose of approximately $1 \times 10^{12}/cm^2$ into an epitaxial semiconductor substrate 11 formed by epitaxially growing, for example, P-type silicon. Subsequently to the ion implantation, short annealing, that is, rapid thermal annealing (RTA), for increasing the temperature at a rate of approximately 100° C./sec. to a high temperature of approximately 900° C. through 1025° C. and keeping the temperature for approximately 1 through 10 seconds is carried out, thereby forming a P-type channel diffusion layer 11a in an upper portion of the epitaxial semiconductor substrate 11. Then, a gate insulating film 12 with a thickness of approximately 2.2 nm is formed on the epitaxial semiconductor substrate 11, and a gate electrode 13 of polysilicon with a thickness of approximately 250 nm is formed on the gate insulating film 12.

Figure 2B:
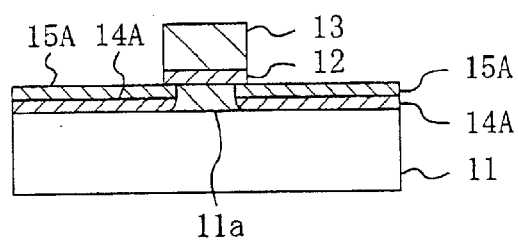

Next, as shown in FIG. 2B with the gate electrode 13 used as a mask, P-type dopant ions such as In ions are implanted into the epitaxial semiconductor substrate 11 at an acceleration energy of approximately 30 keV and a dose of approximately $1 \times 10^{14}/cm^2$. Then, with the gate electrode 13 used as a mask, N-type dopant ions such as As ions are implanted into the epitaxial semiconductor substrate 11 at an acceleration energy of approximately 10 keV and a dose of approximately $5 \times 10^{14}/cm^2$. Thereafter, the rapid thermal annealing for increasing the temperature at a rate of approximately 100° C./sec. to a high temperature of approximately 900° C. through 1025° C. and keeping the temperature for approximately 1 through 10 seconds is carried out. Thus, P-type pocket region of heavily-doped diffusion forming layers 14A and N-type extension region heavily-doped diffusion forming layers 15A having shallower junction than the pocket region of heavily-doped diffusion forming layers 14A are formed in source/drain regions of the epitaxial semiconductor substrate 11.

Figure 2C:
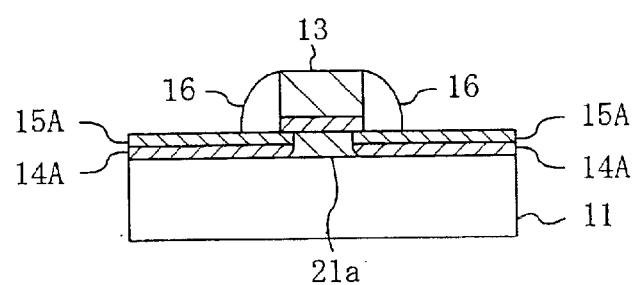

Next, as shown in FIG. 2C, a silicon nitride film with a thickness of approximately 50 nm is deposited on the entire surface of the epitaxial semiconductor substrate 11 so as to cover the gate electrode 13, and the deposited silicon nitride film is subjected to anisotropic etching with strong anisotropy along a direction vertical to the substrate surface. Thus, a sidewall 16 is formed from the silicon nitride film on the side face along the gate length of the gate electrode 13. The sidewall 16 may be formed from a silicon oxide film instead of the silicon nitride film.

Figure 2D:
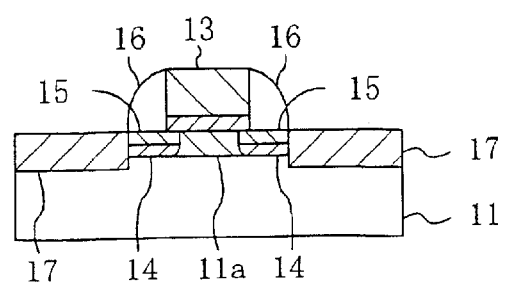

Then, as shown in FIG. 2D, with the gate electrode 13 and the sidewall 16 used as a mask, N-type dopant ions such as As ions are implanted into the epitaxial semiconductor substrate 11 at acceleration energy of approximately 30 keV and a dose of approximately $3 \times 10^{15}/cm^2$. After the ion implantation, the rapid thermal annealing for increasing the temperature at a rate of approximately 100° C./sec. to a high temperature of approximately 1000° C. through 1025° C. and keeping the temperature for approximately 1 through 10 seconds is carried out, thereby forming N-type source/drain heavily-doped diffusion layers 17 in the source/drain regions of the epitaxial semiconductor substrate 11.

In this manner, the following layers are formed: The channel diffusion layer 11a positioned below the gate electrode 13 in the epitaxial semiconductor substrate 11; extension region heavily-doped diffusion layers 15 formed from the extension region heavily-doped diffusion forming layer 15A in the semiconductor substrate 11 on both sides of the gate electrode 13 so as to sandwich the channel diffusion layer 11a; pocket region of heavily-doped diffusion layers 14 formed from the pocket region of heavily-doped diffusion forming layer 14A under the extension region heavily-doped diffusion layers 15; and the source/drain heavily-doped diffusion layers 17 formed in the semiconductor substrate 11 on both sides of the sidewall 16 and in contact with the extension region heavily-doped diffusion layers 15 and the pocket region of heavily-doped diffusion layers 14 at the side edges thereof.

In this manner, Embodiment 1 is characterized by forming the pocket region of heavily-doped diffusion forming layer 14A in the procedure shown in FIG. 2B by implanting the heavy ions into the epitaxial semiconductor substrate 11.

Figure 3:
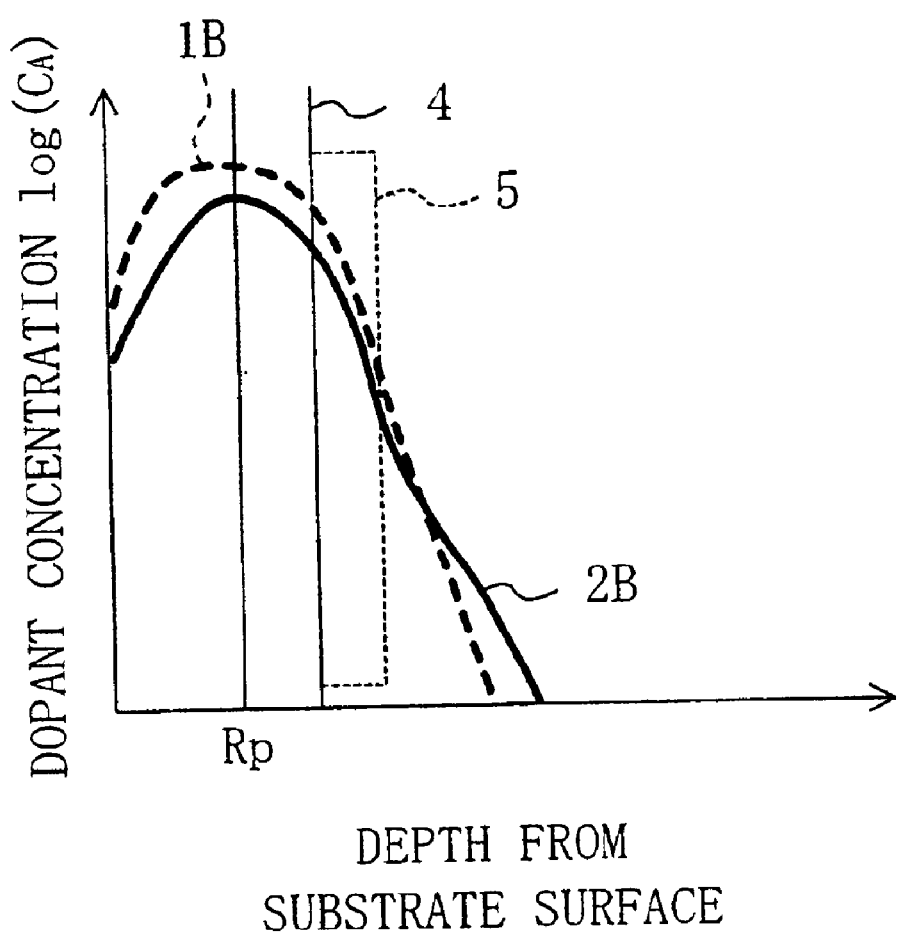
FIG. 3 is a graph for showing a dopant profile in the substrate depth direction obtained immediately after dopant implantation into a pocket region and an extension region in the procedure shown in FIG. 2B in the method for fabricating the MIS transistor of Embodiment 1.

FIG. 3 shows the dopant profile in the substrate depth direction obtained immediately after the dopant implantation into the pocket region and the extension region in the procedure of FIG. 2B. In FIG. 3, a curve 1B indicates the profile of As ions in the extension region, and a curve 2B indicates the profile of In ions in the pocket region. As shown in FIG. 3, the range peaks Rp of the As ions and the In ions are substantially equivalent under the implantation conditions for the As ions and the In ions shown in FIG. 2B, and an amorphous-crystal interface 4 formed by the In ions is deeper than the range peak Rp of the As ions. Furthermore, an EOR dislocation loop defect layer 5 is formed below the amorphous-crystal interface 4 through the subsequent annealing. At this point, since the epitaxial semiconductor substrate 11 is used, the EOR dislocation loop defect layer 5 can be reduced as compared with the case where a semiconductor substrate prepared by the general CZ method is used. Accordingly, the ultimate In ion profile is indicated by a curve having a segregation portion similar to the curve 2A of FIG. 1B.

In Embodiment 1, the formation of an EOR dislocation loop defect layer derived from the change into an amorphous layer caused by the In ions and a leakage current derived from the segregation of the In ions in the EOR dislocation loop defect layer can be suppressed by using the epitaxial wafer as the semiconductor substrate.

An epitaxial silicon wafer itself has a small oxygen content and a small number of crystal defects. Accordingly, the occurrence of EOR dislocation loop defects caused through the annealing after the implantation of the heavy ions can be suppressed by using an epitaxial wafer more approximate to an ideal crystal state than a silicon wafer prepared by the general CZ method.

Additionally, since the In ions sire implanted at a dose of $5 \times 10^{13}/cm^2$ or more in forming the pocket region of heavily-doped diffusion forming layer 14A, a portion of the epitaxial semiconductor substrate 11 is changed into an amorphous layer. Therefore, in the subsequent implantation of the As ions for forming the extension region heavily-doped diffusion forming layer 15A, channeling, that is, a phenomenon that the implanted As ions penetrate between crystal lattices, can be suppressed, resulting in definitely attaining the shallow junction of the extension region heavily-doped diffusion forming layer 15A.

Also, since the In ions, that is, the heavy ions, are used for forming the channel diffusion layer 11a, a dopant concentration distribution in which the concentration of the In ions is low in the vicinity of the surface of the epitaxial semiconductor substrate 11 and is abrupt in a position slightly deeper than the vicinity of the surface can be obtained. As a result, the MIS transistor can be refined without degrading the driving power of the transistor. Furthermore, since the annealing is carried out after implanting the In ions into the channel diffusion layer 11a, the damage caused by implanting the In ions can be rapidly recovered.

Although the rapid thermal annealing is carried out after the ion implantation for forming the pocket region of heavily-doped diffusion forming layers 14A and the extension region heavily-doped diffusion forming layers 15A shown in FIG. 2B and after the ion implantation for forming the source/drain heavily-doped diffusion layers 17 shown in FIG. 2D in Embodiment 1, the rapid thermal annealing may be carried out merely in the procedure shown in FIG. 2D.

The epitaxial semiconductor substrate 11 may have an epitaxial region of silicon at least in a region above the diffusion layers of the transistor. Accordingly, the substrate itself may be an epitaxial wafer prepared by the epitaxial growth or may be an epitaxial substrate with a multi-layer structure prepared by epitaxially growing silicon on a silicon substrate obtained by the CZ method.

The extension region heavily-doped diffusion forming layer 15A may be formed by using another N-type dopant heavy ions having a relatively large mass number, such as antimony (Sb) ions. In this case, the Sb ions may be implanted at an acceleration energy of approximately 10 keV and a dose of approximately $2 \times 10^{14}/cm^2$.

Although the gate electrode 13 is formed from polysilicon in Embodiment 1, the gate electrode 13 may be formed from polymetal instead of polysilicon.

Although the channel diffusion layer 11a is formed by using the In ions in Embodiment 1, B ions or mixed ions of B ions and In ions may be used instead.

Although the MIS transistor of Embodiment 1 is an N-channel MIS transistor, it may be a P-channel MIS transistor instead. In fabricating the P-channel MIS transistor, Sb ions are preferably used as the N-type heavy ions to be implanted for forming the channel diffusion layer 11a and the pocket region of heavily-doped diffusion forming layers 14A.

Embodiment 2

A method for fabricating a semiconductor device according to Embodiment 2 of the invention will now be described with reference to the accompanying drawings.

FIGS. 4A through 4D are cross-sectional views for showing procedures in the method for fabricating a MIS transistor of Embodiment 2.

Figure 4A:
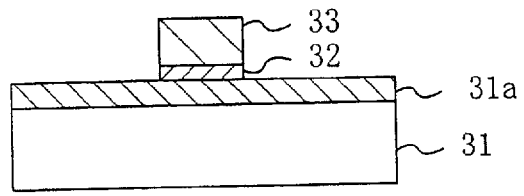
FIGS. 4A, 4B, 4C and 4D are cross-sectional views for showing procedures in a method for fabricating a MIS transistor according to Embodiment 2 of the invention.

First, as shown in FIG. 4A, P-type dopant ions having a relatively large mass number such as In ions are implanted into a semiconductor substrate 31 of P-type silicon at acceleration energy of approximately 200 keV and a dose of approximately $1 \times 10^{12}/cm^2$. After the ion implantation, the rapid thermal annealing for increasing the temperature at a rate of approximately 100° C./sec. to a high temperature of approximately 900° C. through 1025° C. and keeping the temperature for approximately 1 through 10 seconds is carried out, thereby forming a P-type channel diffusion layer 31a in an upper portion of the semiconductor substrate 31. Subsequently, a gate insulating film 32 with a thickness of approximately 2.2 nm is formed on the semiconductor substrate 31, and a gate electrode 33 of polysilicon with a thickness of approximately 250 nm is formed on the gate insulating film 32.

Figure 4B:
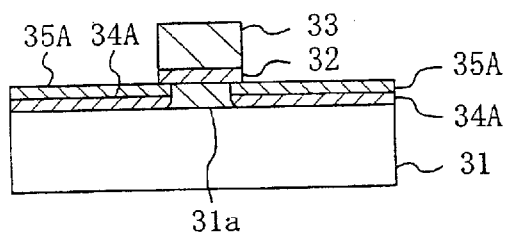

Next, as shown in FIG. 4B, with the gate electrode 33 used as a mask, P-type dopant ions such as In ions are implanted into the semiconductor substrate 31 at an acceleration energy of approximately 30 keV, a dose of approximately $1 \times 10^{14}/cm^2$, a current density of approximately 100 $\mu A/cm^2$ and room temperature. Subsequently, with the gate electrode 33 used as a mask, N-type dopant ions such as As ions are implanted into the semiconductor substrate 31 at an acceleration energy of approximately 10 keV and a dose of approximately $5 \times 10^{14}/cm^2$. Thereafter, the rapid thermal annealing for increasing the temperature at a rate of approximately 100° C./sec. to a high temperature of approximately 900° C. through 1025° C. and keeping the temperature for approximately 1 through 10 seconds is carried out. Thus, P-type pocket region of heavily-doped diffusion forming layers 34A and N-type extension region heavily-doped diffusion forming layers 35A having shallower junction than the pocket region of heavily-doped diffusion forming layers 34A are formed in source/drain regions- of the semiconductor substrate 31.

Figure 4C:
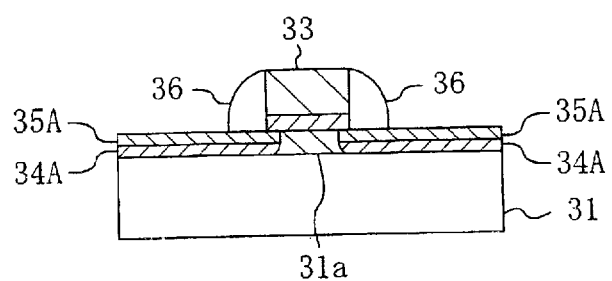

Then, as shown in FIG. 4C, a silicon nitride film with a thickness of approximately 50 nm is deposited on the entire surface of the semiconductor substrate 31 so as to cover the gate electrode 33, and the deposited silicon nitride film is subjected to the anisotropic etching, thereby forming a sidewall 36 of the silicon nitride film on the side face along the gate length of the gate electrode 33. The sidewall 36 may be formed from a silicon oxide film instead of the silicon nitride film.

Figure 4D:
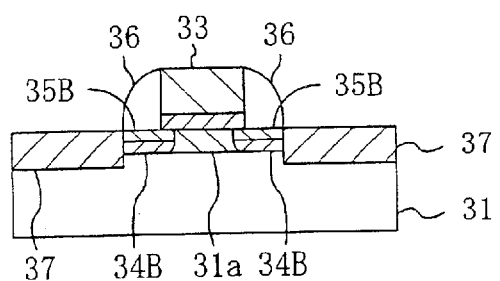

Next, as shown in FIG. 4D, with the gate electrode 33 and the sidewall 36 used as a mask, N-type dopant ions such as As ions are implanted into the semiconductor substrate 31 at acceleration energy of approximately 30 keV and a dose of approximately $3 \times 10^{15}/cm^2$. After the ion implantation, the rapid thermal annealing for increasing the temperature at a rate of approximately 100° C./sec. to a high temperature of approximately 1000° C. through 1025° C. and keeping the temperature for approximately 1 through 10 seconds is carried out. Thus, N-type source/drain heavily-doped diffusion layers 37 are formed in the source/drain regions of the semiconductor substrate 31.

In this manner, the following layers are formed: The channel diffusion layer 31a formed in the semiconductor substrate 31 below the gate electrode 33; extension region heavily-doped diffusion layers 35B formed from the extension region heavily-doped diffusion forming layers 35A in the semiconductor substrate 31 on both sides of the gate electrode 33 so as to sandwich the channel diffusion layer 31a; pocket region of heavily-doped diffusion layers 34B formed from the pocket region of heavily-doped diffusion forming layers 34A under the extension region heavily-doped diffusion layers 35B; and the source/drain heavily-doped diffusion layers 37 formed in the semiconductor substrate 31 on both sides of the sidewall 36 in contact with the extension region heavily-doped diffusion layers 35B and the pocket region of heavily-doped diffusion layers 34B at their side edges.

In this manner, Embodiment 2 is characterized by forming the pocket region of heavily-doped diffusion forming layer 34A by implanting the In ions at a comparatively low current density of 100 $\mu A/cm^2$ at room temperature into the semiconductor substrate 31 in the ion implantation shown in FIG. 4B. Therefore, the implantation damage caused in the semiconductor substrate 31 can be reduced by the In ions implanted at a low current density in forming the pocket region of heavily-doped diffusion forming layer 34A, and hence, formation of interstitial silicon that can be a cause of EOR dislocation loop defects can be suppressed. Accordingly, since the number of EOR dislocation loop defects caused after the annealing can be reduced, the In ions can be prevented from largely segregating in the EOR dislocation loop defect layer. As a result, a leakage current derived from the large segregation of the In ions can be suppressed.

The current density employed in the ion implantation for forming the pocket region of heavily-doped diffusion forming layer 34A is preferably approximately 150 $\mu$A/cm$^2$ or less and more preferably approximately 100 $\mu$A/cm$^2$ or less.

In addition, the In ions are implanted at a dose of $5\times10^{13}$/cm$^2$ or more in forming the pocket region of heavily-doped diffusion forming layer 34A, and hence, a portion of the semiconductor substrate 31 is changed into an amorphous layer. Therefore, the channeling of the implanted As ions can be suppressed in the subsequent ion implantation of the As ions for forming the extension region heavily-doped diffusion forming layer 35A. As a result, the extension region heavily-doped diffusion forming layer 35A can definitely attain shallow junction.

Also, since the In ions, that is, heavy ions, are also used for forming the channel diffusion layer 31a, a dopant concentration distribution in which the concentration of the In ions is low in the vicinity of the surface of the semiconductor substrate 31 and is abrupt in a position slightly deeper than the vicinity of the surface can be attained. Therefore, the MIS transistor can be refined without degrading the driving power of the transistor. Furthermore, since the annealing is carried out after implanting the In ions for forming the channel diffusion layer 31a, the implantation damage caused by the In ions can be rapidly recovered.

Also in Embodiment 2, the extension region heavily-doped diffusion forming layer 35A may be formed by using another N-type heavy ions having a relatively large mass number such as Sb ions. In this case, the Sb ions may be implanted at an acceleration energy of approximately 10 keV and a dose of approximately $2\times10^{14}$/cm$^2$.

Although the rapid thermal annealing is carried out 15 after the ion implantation for forming the pocket region of heavily-doped diffusion forming layers 34A and the extension region heavily-doped diffusion forming layers 35A shown in FIG. 4B and after the implantation for forming the source/drain heavily-doped diffusion layers 37 shown in FIG. 4D in Embodiment 2, the rapid thermal annealing may be carried out merely in the procedure of FIG. 4D.

Although the gate electrode 33 is formed from polysilicon, the gate electrode 33 may be formed from polymetal instead of polysilicon.

Although the channel diffusion layer 31a is formed by using the In ions, B ions or mixed ions of B ions and In ions may be used instead.

Although the MIS transistor of Embodiment 2 is an N-channel MIS transistor, it may be a P-channel MIS transistor. In forming the P-channel MIS transistor, Sb ions are preferably used as the N-type heavy ions to be implanted for forming the channel diffusion layer 31a and the pocket region of heavily-doped diffusion forming layers 34A.

Embodiment 3

A method for fabricating a semiconductor device according to Embodiment 3 of the invention will now be described with reference to the accompanying drawings.

FIGS. 5A through 5D are cross-sectional views for showing procedures in the method for fabricating a MIS transistor of Embodiment 3.

Figure 5A:
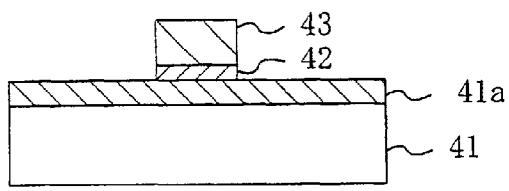
FIGS. 5A, 5B, 5C and 5D are cross-sectional views for showing procedures in a method for fabricating a MIS transistor according to Embodiment 3 of the invention.

First, as shown in FIG. 5A, P-type dopant ions with a relatively large mass number such as In ions are implanted at acceleration energy of approximately 200 keV and a dose of approximately $1\times10^{12}$/cm$^2$ into a semiconductor substrate 41 of, for example, P-type silicon. After the ion implantation, the rapid thermal annealing for increasing the temperature at a rate of approximately 100° C./sec. to a high temperature of approximately 900° C. through 1025° C. and keeping the temperature for approximately 1 through 10 seconds is carried out, thereby forming a P-type channel diffusion layer 41a in an upper portion of the semiconductor substrate 41. Subsequently, a gate insulating film 42 with a thickness of approximately 2.2 nm is formed on the semiconductor substrate 41, and a gate electrode 43 of polysilicon with a thickness of approximately 250 nm is formed on the gate insulating film 42.

Figure 5B:
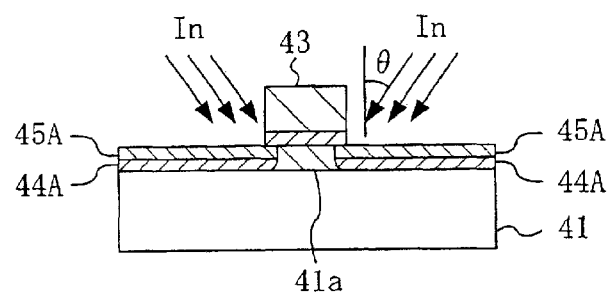

Next, as shown in FIG. 5B, with the gate electrode 43 used as a mask, P-type dopant ions such as In ions are implanted into the semiconductor substrate 41 at an acceleration energy of approximately 30 keV, a dose of approximately $1\times10^{14}$/cm$^2$ and a tilt angle ø against each side face along the gate length of the gate electrode 43 of approximately 45 degrees. Subsequently, with the gate electrode 43 used as a mask, N-type dopant ions such as As ions are implanted into the semiconductor substrate 41 at an acceleration energy of approximately 10 keV and a dose of approximately $5\times10^{14}$/cm$^2$. At this point, the tilt angle ø for implanting the As ions is approximately 0 through 7 degrees. Thereafter, the rapid thermal annealing for increasing the temperature at a rate of approximately 100° C. /sec. to a high temperature of approximately 900° C. through 1025° C. and keeping the temperature for approximately 1 through 10 seconds is carried out. Thus, P-type pocket region of heavily-doped diffusion forming layers 44A and N-type extension region heavily-doped diffusion forming layers 45A having shallower junction than the pocket region of heavily-doped diffusion forming layers 44A are formed in source/drain regions of the semiconductor substrate 41.

Figure 5C:
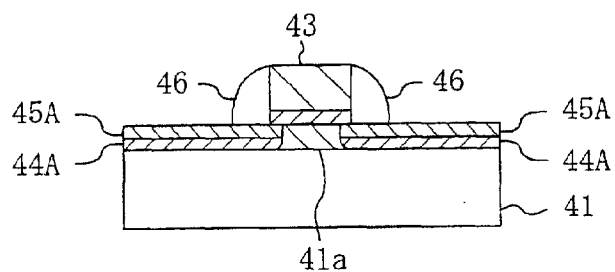

Next, as shown in FIG. 5C, a silicon nitride film with a thickness of approximately 50 nm is deposited on the entire surface of the semiconductor substrate 41 so as to cover the gate electrode 43, and the deposited silicon nitride film is subjected to the anisotropic etching, thereby forming a sidewall 46 from the silicon nitride film on the side face along the gate length of the gate electrode 43. The sidewall 46 may be formed from a silicon oxide film instead of the silicon nitride film.

Figure 5D:
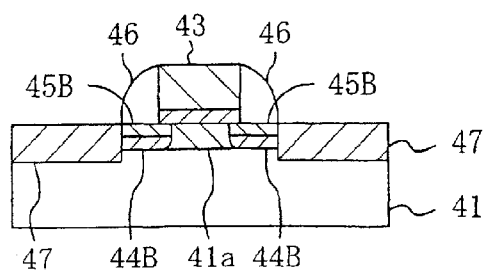

Then, as shown in FIG. 5D, with the gate electrode 43 and the sidewall 46 used as a mask, N-type dopant ions such as As ions are implanted into the semiconductor substrate 41 at acceleration energy of approximately 30 keV and a dose of approximately $3\times10^{15}$/cm$^2$. After the ion implantation, the rapid thermal annealing for increasing the temperature at a rate of approximately 100° C./sec. to a high temperature of approximately 1000° C. through 1025° C. and keeping the temperature for approximately 1 through 10 seconds is carried out, thereby forming N-type source/drain heavily-doped diffusion layers 47 in the source/drain regions of the semiconductor substrate 41.

In this manner, the following layers are formed: The channel diffusion layer 41a formed in the semiconductor substrate 41 below the gate electrode 43; extension region heavily-doped diffusion layers 45B formed from the extension region heavily-doped diffusion forming layers 45A in the semiconductor substrate 41 on both sides of the gate electrode 43 so as to sandwich the channel diffusion layer 41a; pocket region of heavily-doped diffusion layers 44B formed from the pocket region of heavily-doped diffusion forming layers 44A under the extension region heavily-doped diffusion layers 45B; and the source/drain heavily-doped diffusion layers 47 formed in the semiconductor substrate 41 on both sides of the sidewall 46 in contact with the extension region heavily-doped diffusion layers 45B and the pocket region of heavily-doped diffusion layers 44B at their side edges.

In this manner, Embodiment 3 is characterized by forming the pocket region of heavily-doped diffusion forming layer 44A by implanting the In ions into the semiconductor substrate 41 at a comparatively large tilt angle of approximately 45 degrees against the side face of the gate electrode 43 in the ion implantation shown in FIG. 5B. Therefore, the implantation damage caused in the semiconductor substrate 41 can be reduced because of the In ions implanted obliquely to the substrate surface in forming the pocket region of heavily-doped diffusion forming layer 44A. Accordingly, the formation of interstitial silicon that can be a cause of EOR dislocation loop defects can be suppressed. As a result, the number of EOR dislocation loop defects caused after the annealing can be reduced, and hence, the In ions are not strongly segregated in the EOR dislocation loop defect layer, resulting in suppressing a leakage current derived from the strong segregation of the In ions.

The tilt angle ø employed in the ion implantation for forming the pocket region of heavily-doped diffusion forming layer 44A is preferably approximately 30 through 60 degrees and more preferably approximately 45 degrees.

In addition, the In ions are implanted at a dose of $5 \times 10^{13}/cm^2$ or more in forming the pocket region of heavily-doped diffusion forming layer 44A, and hence, a portion of the semiconductor substrate 41 is changed into an amorphous layer. Therefore, the channeling of the implanted As ions can be suppressed in the subsequent ion implantation of the As ions for forming the extension region heavily-doped diffusion forming layer 45A. As a result, the extension region heavily-doped diffusion forming layer 45A can definitely attain shallow junction.

Also, since the In ions, that is, heavy ions, are also used for forming the channel diffusion layer 41a, a dopant concentration distribution in which the concentration of the In ions is low in the vicinity of the surface of the semiconductor substrate 41 and is abrupt in a position slightly deeper than the vicinity of the surface can be attained. Therefore, the MIS transistor can be refined without degrading the driving power of the transistor. Furthermore, since the annealing is carried out after implanting the In ions for forming the channel diffusion layer 41a, the implantation damage caused by the In ions can be rapidly recovered.

Also in Embodiment 3, the extension region heavily-doped diffusion forming layer 45A may be formed by using another N-type heavy ions having a relatively large mass number such as Sb ions. In this case, the Sb ions may be implanted at an acceleration energy of approximately 10 keV and a dose of approximately $2 \times 10^{14}/cm^2$.

Although the rapid thermal annealing is carried out after the ion implantation for forming the pocket region of heavily-doped diffusion forming layers 44A and the extension region heavily-doped diffusion forming layers 45A shown in FIG. 5B and after the implantation for forming the source/drain heavily-doped diffusion layers 47 shown in FIG. 5D in Embodiment 3, the rapid thermal annealing may be carried out merely in the procedure of FIG. 5D.

Although the gate electrode 43 is formed from polysilicon, the gate electrode 43 may be formed from polymetal instead of polysilicon.

Although the channel diffusion layer 41a is formed by using the In ions, B ions or mixed ions of B ions and In ions may be used instead.

Although the MIS transistor of Embodiment 3 is an N-channel MIS transistor, it may be a P-channel MIS transistor. In forming the P-channel MIS transistor, Sb ions are preferably used as the N-type heavy ions to be implanted for forming the channel diffusion layer 41a and the pocket region of heavily-doped diffusion forming layers 44A.

Embodiment 4

Embodiment 4 of the invention will now be described with reference to the accompanying drawings.

Figure 6A:
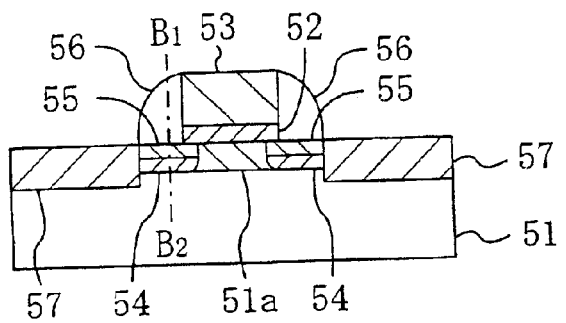
FIG. 6A is a cross-sectional view of a MIS transistor according to Embodiment 4 of the invention and FIG. 6B is a graph for showing a dopant concentration in a depth direction from a substrate surface along line $B_1$-$B_2$ of FIG. 6A.
Figure 6B:
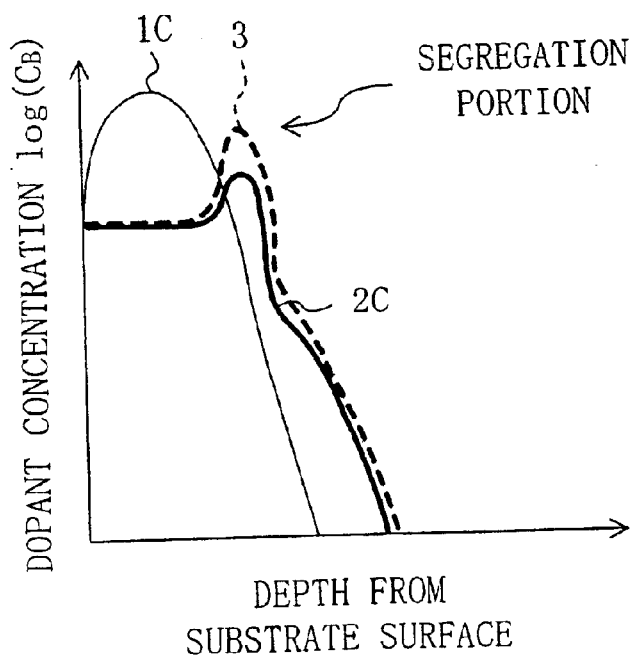

FIG. 6A is a cross-sectional view of a MIS transistor according to Embodiment 4 of the invention and FIG. 6B is a graph for showing a dopant concentration in a depth direction from a substrate surface along line $B_1$-$B_2$ of FIG. 6A.

As shown in FIG. 6A, a gate electrode 53 of polysilicon is formed on a gate insulating film 52 formed on a semiconductor substrate 51 of P-type silicon having a <110> oriented zone axis, namely, having a principal plane with the {110} surface orientation (hereinafter referred to as the <110> semiconductor substrate 51).

In an upper portion of the <110> semiconductor substrate 51, source/drain heavily-doped diffusion layers 57 where N-type As ions are diffused are formed in source/drain regions on both sides of a sidewall 56 of the gate electrode 53 at a distance from a region below each side face of the gate electrode 53. Between the source/drain heavily-doped diffusion layer 57 and the region below the side face of the gate electrode 53, an extension region heavily-doped diffusion layer 55 where N-type As ions are diffused to have shallower junction than the source/drain heavily-doped diffusion layer 57 is formed, and under the extension region heavily-doped diffusion layer 55, a pocket region of heavily-doped diffusion layer 54 where P-type In ions, that is, heavy ions having a relatively large mass number, are diffused is formed.

Furthermore, in a portion of the <110> semiconductor substrate Si below the gate electrode 53 and sandwiched between the extension region heavily-doped diffusion layers 55 and between the pocket region of heavily-doped diffusion layers 54, a channel diffusion layer 51a where P-type In ions are diffused is formed.

In this manner, the MIS transistor of this embodiment is characterized by including the pocket region of heavily-doped diffusion layer 54 where the In ions, that is, the heavy ions, are diffused in the <110> semiconductor substrate 51.

In FIG. 6B, a curve 1C indicates an As ion concentration in the extension region heavily-doped diffusion layer 55 and a curve 2C indicates an In ion concentration in the pocket region of heavily-doped diffusion layer 54. A curve 3 indicates, for a comparison, an In ion concentration in a pocket region of heavily-doped diffusion layer formed in a semiconductor substrate of a general silicon wafer having a <100>-oriented zone axis.

In the semiconductor fabrication process, a heavy ion having a relatively large mass number such as an In ion exhibits abrupt and shallow profile as compared with an ion having a relatively small mass number such as a boron (B) ion. In addition, as shown in FIG. 6B, the heavy ions are less diffused in a tale portion with a low concentration in the dopant profiled namely, in a deep region, owing to segregation in a defect layer or surface diffusion. Therefore, an abrupt profile can be realized in not only the curve 1C of the dopant concentration of the extension region heavily-doped diffusion layer 55 but also the curve 2C of the dopant concentration of the pocket region of heavily-doped diffusion layer 54. As a result, even in a MIS transistor with a small gate length, shallow junction can be obtained, so as to realize high driving power. Furthermore, since the extension region heavily-doped diffusion layer 55 and the pocket region of heavily-doped diffusion layer 54 can be formed with shallow junction, the short channel effect can be suppressed, and hence, a fine transistor can be designed.

Furthermore, since the <110> semiconductor substrate 51 is used as the semiconductor substrate of this embodiment, the implanted In ions are positively channeled. Since the implanted In ions thus minimally collide with a silicon crystal lattice of the substrate, the implantation damage of the silicon crystal lattice caused by the In ions is reduced, and hence, the formation of interstitial silicon that can be a cause of EOR dislocation loop defects can be reduced.

As a result, as understood from FIG. 6B, the number of EOR dislocation loop defects is smaller in the dopant curve 2C of the pocket region of heavily-doped diffusion layer 54 of this embodiment than in the dopant curve 3 of the pocket region of heavily-doped diffusion layer formed in the conventional <100> semiconductor substrate, and the peak of a segregation portion of the In ions in the EOR dislocation loop defect layer is lowered. Also, a leakage current derived from the EOR dislocation loop defects can be suppressed.

Even though the In ion implanted into the <110> semiconductor substrate 51 is channeled, the implantation range is not largely increased owing to the mass effect of In as compared with that of a typical light ion, and hence, the channeling is not an obstacle to shallow junction.

A method for fabricating the MIS transistor having the aforementioned structure will now be described with reference to the accompanying drawings.

FIGS. 7A through 7D are cross-sectional views for showing procedures in the method for fabricating a MIS transistor of Embodiment 4.

Figure 7A:
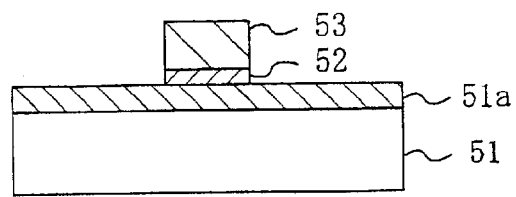
FIGS. 7A, 7B, 7C and 7D are cross-sectional views for showing procedures in a method for fabricating the MIS transistor of Embodiment 4.

First, as shown in FIG. 7A, P-type dopant ions with a relatively large mass number such as In ions are implanted into a <110> semiconductor substrate 51 of P-type silicon at acceleration energy of approximately 200 keV and a dose of approximately $1 \times 10^{12}/cm^2$. After the ion implantation, the rapid thermal annealing for increasing the temperature at a rate of approximately 100° C./sec. to a high temperature of approximately 900° C. through 1025° C. and keeping the temperature for approximately 1 through 10 seconds is carried out, thereby forming a P-type channel diffusion layer 51a in an upper portion of the <110> semiconductor substrate 51. Subsequently, a gate insulating film 52 with a thickness of approximately 2.2 nm is formed on the <110> semiconductor substrate 51, and a gate electrode 53 of polysilicon with a thickness of approximately 250 nm is formed on the gate insulating film 52.

Figure 7B:
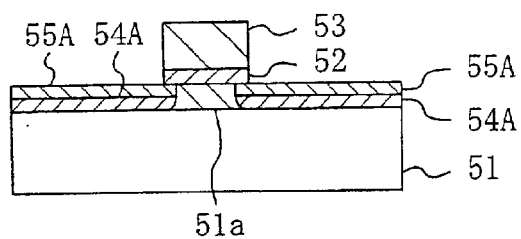

Next, as shown in FIG. 7B, with the gate electrode 53 used as a mask, P-type dopant ions such as In ions are implanted into the <110> semiconductor substrate 51 at an acceleration energy of approximately 30 keV and a dose of approximately $1 \times 10^{14}/cm^2$. Subsequently, with the gate electrode 53 used as a mask, N-type dopant ions such as As ions are implanted into the <110> semiconductor substrate 51 at an acceleration energy of approximately 10 keV and a dose of approximately $5 \times 10^{14}/cm^2$. Thereafter, the rapid thermal annealing for increasing the temperature at a rate of approximately 100° C. /sec. to a high temperature of approximately 900° C. through 1025° C. and keeping the temperature for approximately 1 through 10 seconds is carried out. Thus, P-type pocket region of heavily-doped diffusion forming layers 54A and N-type extension region heavily-doped diffusion forming layers 55A with shallower junction than the pocket region of heavily-doped diffusion forming layers 54A are formed in source/drain regions of the <110> semiconductor substrate 51.

Figure 7C:
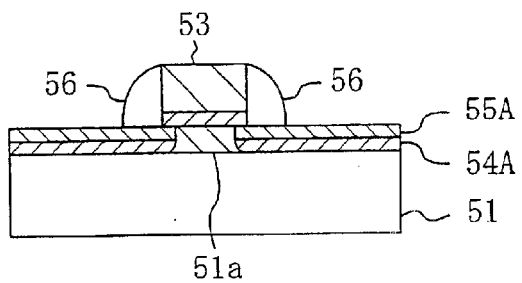

Then, as shown in FIG. 7C, a silicon nitride film with a thickness of approximately 50 nm is deposited on the entire surface of the <110> semiconductor substrate 51 so as to cover the gate electrode 53, and the deposited silicon nitride film is subjected to the anisotropic etching, thereby forming a sidewall 56 from the silicon nitride film on the side face along the gate length of the gate electrode 53. The sidewall 56 may be formed from a silicon oxide film instead of the silicon nitride film.

Figure 7D:
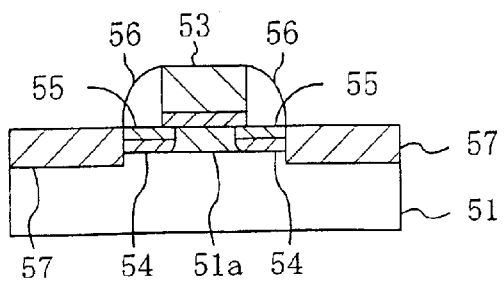
Figure 8A:
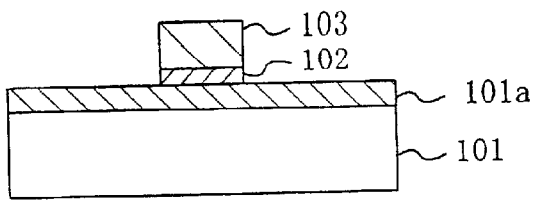
FIGS. 8A, 8B, 8C, 8D and 8E are cross-sectional views for showing procedures in a method for fabricating a conventional MIS transistor.
Figure 8B:
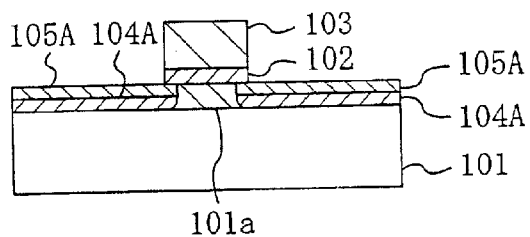
Figure 8C:
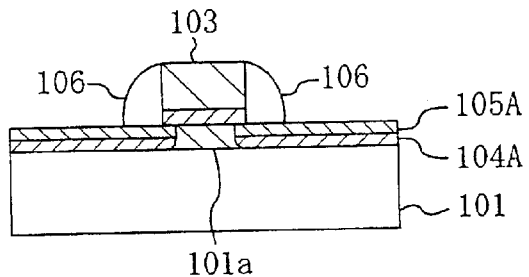
Figure 8D:
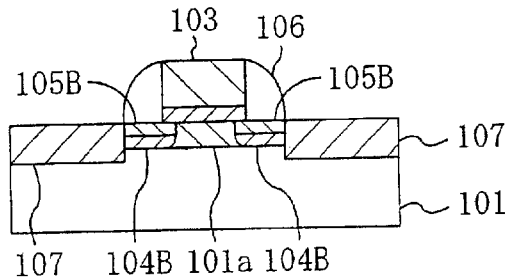
Figure 8E:
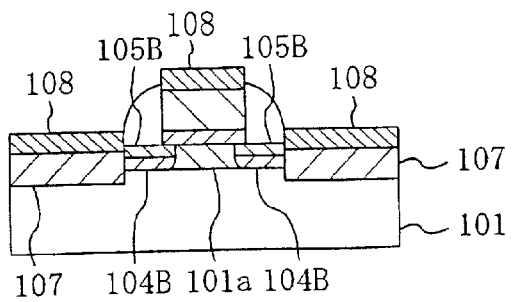

Next, as shown in FIG. 7D, with the gate electrode 53 and the sidewall 56 used as a mask, N-type dopant ions such as As ions are implanted into the <110> semiconductor substrate 51 at acceleration energy of approximately 30 keV and a dose of approximately $3 \times 10^{15}/cm^2$. After the implantation, the rapid thermal annealing for increasing the temperature at a rate of approximately 100° C./sec. to a high temperature of approximately 1000° C. through 1025° C. and keeping the temperature for approximately 1 through 10 seconds is carried out, thereby forming N-type source/drain heavily-doped diffusion layers 57 in the source/drain regions of the <110> semiconductor substrate 51.

In this manner, the following layers are formed: The channel diffusion layer 51a formed in the <110> semiconductor substrate 51 below the gate electrode 53; extension heavily-doped diffusion layers 55B formed from the extension heavily-doped diffusion forming layers 55A in the semiconductor substrate 51 on both sides of the gate electrode 53 so as to sandwich the channel diffusion layer 51a; pocket heavily-doped diffusion layers 54B formed from the pocket heavily-doped diffusion forming layers 54A under the extension heavily-doped diffusion layers 55B; and the source/drain heavily-doped diffusion layers 57 formed in the semiconductor substrate 51 on both sides of the sidewall 56 in contact with the extension heavily-doped diffusion layers 55 and the pocket heavily-doped diffusion layers 54 at their side edges.

In this manner, Embodiment 4 is characterized by forming pocket region of heavily-doped diffusion forming layer 54A by implanting heavy ions into <110> semiconductor substrate 51 in the procedure shown in FIG. 7B. Therefore, the implanted In ions minimally collide with the silicon crystal lattice because of the channeling of the implanted In ions as described above, and hence, the implantation damage caused in the silicon crystal lattice by the In ions is reduced, so as to reduce the formation of interstitial silicon that can be a cause of EOR dislocation loop defects. At this point, even though the implanted In ion is channeled, the implantation range is not largely increased due to the mass effect of In as compared with that of another light ion. Since the implantation damage caused by the In ions is thus reduced, the interstitial silicon that can be a cause of the EOR dislocation loop defects is reduced, and hence, the formation of the EOR dislocation loop defect layer is suppressed, resulting in reducing the In ions segregated in the EOR dislocation loop defect layer. As a result, the pocket region of heavily-doped diffusion layer 54 can be formed by using the heavy ions without increasing a leakage current.

In addition, even though the implantation damage caused by the In ions is reduced, since a portion of the <110> semiconductor substrate 51 is changed into an amorphous layer, the implantation of the As ions for forming the extension region heavily-doped diffusion forming layer 55A carried out after the pocket implantation of the In ions is conducted on the amorphous silicon layer. Therefore, a pre-amorphous effect works. Accordingly, the channeling of the As ions used for the extension implantation can be suppressed, so that the extension region heavily-doped diffusion layer 55 can be formed to have very shallow junction.

Also, since the In ions, that is, heavy ions, are also used for forming the channel diffusion layer 51a, a dopant concentration distribution in which the concentration of the In ions is low in the vicinity of the surface of the <110> semiconductor substrate 51 and is abrupt in a position slightly deeper than the vicinity of the surface can be attained. Therefore, the MIS transistor can be refined without degrading the driving power of the transistor. Furthermore, since the annealing is carried out after implanting the In ions for forming the channel diffusion layer 51*a*, the implantation damage caused by the In ions can be rapidly recovered.

Although the rapid thermal annealing is carried out after the ion implantation for forming the pocket regions of heavily doped diffusion forming layers 54A and the extension regions heavily-doped diffusion forming layers 55A shown in FIG. 7B and after the implantation for forming the source/drain heavily-doped diffusion layers 57 shown in FIG. 7D in Embodiment 4, the rapid thermal annealing may be carried out merely in the procedure of FIG. 7D.

Also in Embodiment 4, the extension region heavily-doped 20 diffusion forming layer 55A may be formed by using another N-type heavy ions having a relatively large mass number such as Sb ions. In this case, the Sb ions may be implanted at an acceleration energy of approximately 10 keV and a dose of approximately $2 \times 10^{14}/cm^2$.

Although the gate electrode 53 is formed from polysilicon, the gate electrode 53 may be formed from polymetal instead of polysilicon.

Although the channel diffusion layer 51*a* is formed by using the In ions, B ions or mixed ions of B ions and In ions may be used instead.

Although the MIS transistor of Embodiment 4 is an N-channel MIS transistor, it may be a channel MIS transistor. IN forming the P-channel MIS transistor, Sb ions are preferably used as the N-type heavy ions to be implanted for forming the channel diffusion layer 51*a* and the pocket regions of heavily-doped diffusion forming layers 54A.

Furthermore, the <110> semiconductor substrate 51 may be an epitaxial semiconductor substrate of silicon having a principal plane with the <110>-oriented zone axis.

What is claimed is:

1. A semiconductor device comprising:
    a MIS transistor formed on a semiconductor substrate,
    wherein said semiconductor substrate is an epitaxial semiconductor substrate having an expitaxial region formed by epitaxial growing silicon on a silicon substrate
    said MIS transistor includes a gate electrode formed above said epitaxial region with a gate insulating film sandwiched therebetween and a diffusion layer formed in said expitaxial region, by using a dopant ion having a relatively large mass number, and
    said diffusion layer is formed shallower than said epitaxial region.

2. The semiconductor device of claim 1, wherein said epitaxial region has a <110>-oriented zone axis.

3. The semiconductor device of claim 2, wherein said diffusion layer is formed by using, as said dopant ion, an indium ion.

4. The semiconductor device of claim 1, wherein said diffusion layer is formed by using, as said dopant ion, an indium ion.

5. The semiconductor device of claim 4, wherein said diffusion layer is formed by said indium ion at a dose of $5 \times 10^{13}/cm^2$ or more.

6. The semiconductor device of claim 4, wherein said diffusion layer corresponds to a pocket diffusion layer of said MIS transistor, and said MIS transistor includes:
    a source/drain diffusion layer of a first conductivity type formed in a source/drain region of said epitaxial region at a distance from a region below a side face of said gate electrode;
    an extension diffusion layer of the first conductivity type formed in said epitaxial region between said source/drain diffusion layer and said region below the side face of said gate electrode and having shallower junction than said source/drain diffusion layer; and
    said pocket diffusion layer of a second conductivity type formed in said epitaxial region under said extension diffusion layer.

7. The semiconductor device of claim 6, wherein said extension diffusion layer is formed using an antimony ion as a dopant.

8. The semiconductor device of claim 4, wherein said diffusion layer is a channel diffusion layer formed below said gate electrode in said epitaxial region.

9. The semiconductor device of claim 4, wherein said diffusion layer is a pocket diffusion layer formed on both sides of said gate electrode in said epitaxial region.

10. The semiconductor device of claim 1, wherein said diffusion layer corresponds to a pocket diffusion layer of said MIS transistor, and said MIS transistor includes:
    a source/drain diffusion layer of a first conductivity type formed in a source/drain region of said epitaxial region at a distance from a region below a side face of said gate electrode;
    an extension diffusion layer of the first conductivity type formed in said epitaxial region between said source/drain diffusion layer and said region below the side face of said gate electrode and having shallower junction than said source/drain diffusion layer; and
    said pocket diffusion layer of a second conductivity type formed in said epitaxial region under said extension diffusion layer.

11. The semiconductor device of claim 10, wherein said extension diffusion layer is formed by using an antimony ion as a dopant.

12. The semiconductor device of claim 1, wherein said diffusion layer is formed by using, as said dopant ion, an antimony ion.

13. The semiconductor device of claim 1, wherein said diffusion layer is a channel diffusion layer formed below said gate electrode in said epitaxial region.

14. The semiconductor device of claim 1, wherein said diffusion layer is a pocket diffusion layer formed on both sides of said gate electrode in said epitaxial region.

15. The semiconductor device of claim 1, wherein said silicon substrate has a Cz crystal substrate formed by using Cz method.

16. A semiconductor device comprising:
    a MIS transistor formed on a semiconductor substrate,
    wherein said semiconductor substrate composed of silicon and having a main surface of {110}- orientation, and
    said MIS transistor includes a gate electrode formed above said semiconductor substrate with a sate insulating film sandwiched therebetween and a diffusion layer formed, by using a dopant ion having a relatively large mass number, in said semiconductor substrate.

17. The semiconductor device of claim 16, wherein said diffusion layer is formed by using, as said dopant ion, an indium ion.

18. The semiconductor device of claim 17, wherein said diffusion layer is formed by said indium ion at a dose of $5 \times 10^{13}/cm^2$ or more.

19. The semiconductor device of claim 17, wherein said diffusion layer corresponds to a pocket diffusion layer of said MIS transistor, and said MIS transistor includes:

a source/drain diffusion layer of a first conductivity type formed in a source/drain region of said semiconductor substrate at a distance from a region below a side face of said gate electrode;

an extension diffusion layer of the first conductivity type formed in said semiconductor substrate between said source/drain diffusion layer and said region below the side face of said gate electrode and having shallower junction than said source/drain diffusion layer; and said pocket diffusion layer of a second conductivity type formed in said semiconductor substrate under said extension diffusion layer.

20. The semiconductor device of claim 19, wherein said extension diffusion layer is formed using an antimony ion as a dopant.

21. The semiconductor device of claim 17, wherein said diffusion layer is a channel diffusion layer formed below said gate electrode in said semiconductor substrate.

22. The semiconductor device of claim 17, wherein said diffusion layer is a pocket diffusion layer formed on both sides of said gate electrode in said semiconductor substrate.

23. The semiconductor device of claim 16, wherein said diffusion layer corresponds to a pocket diffusion layer of said MIS transistor, and said MIS transistor includes:

a source/drain diffusion layer of a first conductivity type formed in a source/drain region of said semiconductor substrate at a distance from a region below a side face of said gate electrode;

an extension diffusion layer of the first conductivity type formed in said semiconductor substrate between said source/drain diffusion layer and said region below the side face of said gate electrode and having shallower junction than said source/drain diffusion layer; and said pocket diffusion layer of a second conductivity type formed in said semiconductor substrate under said extension diffusion layer.

24. The semiconductor substrate of claim 23, wherein said extension diffusion is formed by using an antimony ion as a dopant.

25. The semiconductor device of claim 16, wherein said diffusion layer is formed by using, as said dopant ion, an antimony ion.

* * * * *